United States Patent
Vashchenko et al.

(10) Patent No.: US 7,221,608 B1
(45) Date of Patent: May 22, 2007

(54) SINGLE NMOS DEVICE MEMORY CELL AND ARRAY

(75) Inventors: Vladislav Vashchenko, Palo Alto, CA (US); Peter J. Hopper, San Jose, CA (US); Philipp Lindorfer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/957,986

(22) Filed: Oct. 4, 2004

(51) Int. Cl.
*G11C 7/00* (2006.01)
(52) U.S. Cl. ............................. 365/222; 365/177
(58) Field of Classification Search ............. 365/177, 365/222, 149
See application file for complete search history.

(56) References Cited

U.S. PATENT DOCUMENTS

| | | | | |
|---|---|---|---|---|
| 5,109,361 A | * | 4/1992 | Yim et al. | 365/185.12 |
| 5,208,780 A | * | 5/1993 | Iwase et al. | 365/96 |
| 5,365,487 A | * | 11/1994 | Patel et al. | 365/222 |

* cited by examiner

*Primary Examiner*—Huan Hoang
(74) *Attorney, Agent, or Firm*—Stallman & Pollack LLP

(57) ABSTRACT

The snapback characteristics of the parasitic NPN structure inside an NMOS device are used to write and store information in the device by periodically triggering the device from the high impedance state to the low impedance state using the self turn-on characteristics of the device under elevated voltage. To minimize power consumption, and thus overheating, in the "on" state, a pulsed mode operation is combined with dV/dt triggering powering the device at a constant Vdd pulse amplitude.

2 Claims, 9 Drawing Sheets

SINGLE NMOS DEVICE MEMORY CELL AND ARRAY

TECHNICAL FIELD

The present invention relates to a semiconductor memory cell that is based upon the snapback characteristics of the parasitic NPN structure inside an NMOS device.

BACKGROUND OF THE INVENTION

There are a number of well-known basic architectures for volatile MOS random access memory (RAM) cells. These include the conventional dynamic RAM (DRAM) cell that utilizes a storage capacitor and an NMOS transfer device connected to the bit and word lines of the memory array. Conventional static RAM (SRAM) cell architectures include a six-transistor design in which coupled latch invertors are controlled by two NMOS devices connected to the bit and word lines. In a variation of the six-transistor SRAM cell, a four-transistor design is used and the PMOS devices in the coupled latch invertors are replaced by large resistors.

Well-known non-volatile memory cell architectures include electrically programmable read only memory (EPROM) and flash EPROM cells in which a floating gate is used to store information in an NMOS device that is connected directly to the bit and word lines. Non-volatile cells also include two-transistor electrically erasable programmable read only memory (EEPROM) cells in which, in addition to the EPROM device elements, an extra NMOS device is included to interface with the bit and word lines.

Thus, in the conventional memory cell architectures, information storage is based upon either triggering into a new current conducting state, which requires refreshing, or charge storage in a floating gate, which requires a more complex cell.

There are also a number of lesser-utilized memory architectures, such as, for example, ferro-electric, spin valve and molecular memories, that are not directly compatible with CMOS processing.

The present invention provides a new semiconductor memory cell that is based upon the well-known snapback characteristics of the parasitic NPN structure inside an NMOS device. The memory cell is based upon the dynamic storing and reading of information utilizing a short pulse operation mode for both Vds and Vgs. The cell relies upon the dependence of the drain-source triggering voltage upon the previously injected carrier within the P-well of the device. The cell self-refreshes in the "on" state by using periodic drain-source Vds voltage pulses having a width of 0.1–10 ns and a period of 10–100 ns with or without a Vgs hold. The turn-on of the cell is controlled by the gate-source voltage Vgs or the control electrode voltage. The state of the memory cell is read by applying Vgs read and Vds read voltages between the refresh pulses to the corresponding bit and word buses. Individual cells are erased by a short pulse application of the Vgs erase and Vds erase signals to the cell. The entire array is erased by a short pulse application the Vds erase signal to the array.

The features and advantages of the present invention will be more fully appreciated upon consideration of the following detailed description of the invention and the accompanying drawings that set forth an illustrative embodiment in which the principles of the invention are utilized.

DESCRIPTION OF THE INVENTION

Figure 1A:
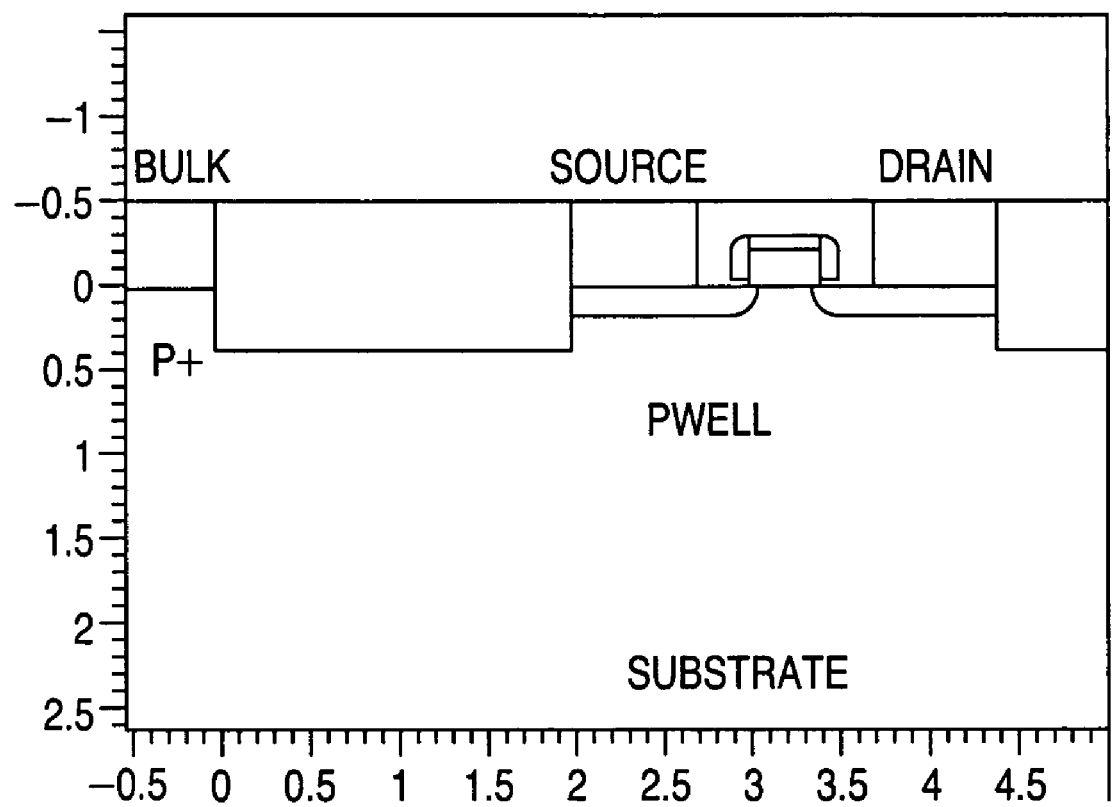
FIG. 1A is a partial cross-section drawing illustrating a memory cell architecture in accordance with the concepts of the present invention.
Figure 1B:
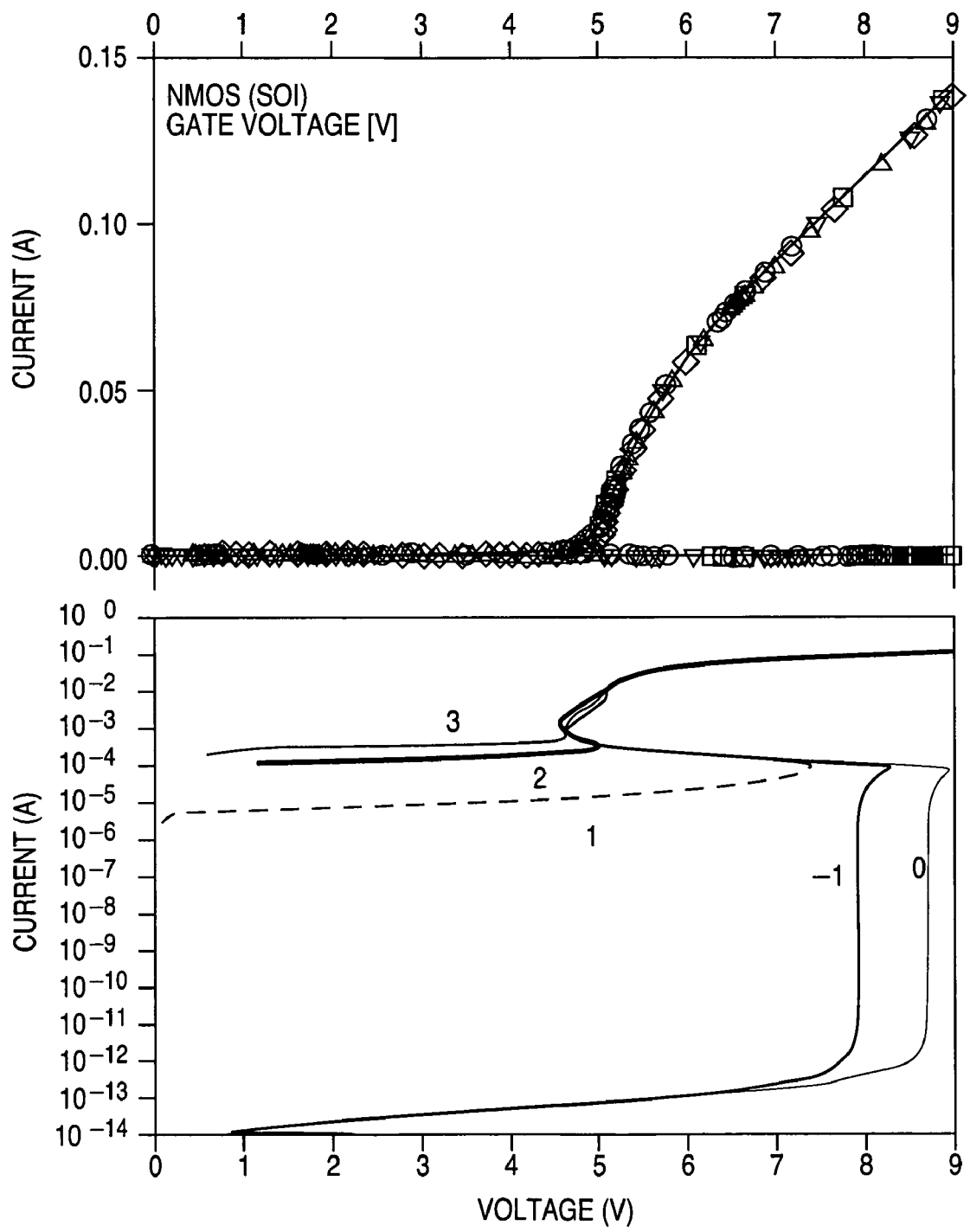
FIG. 1B provides graphs illustrating the operational characteristics of the FIG. 1A memory cell architecture.
Figure 2B:
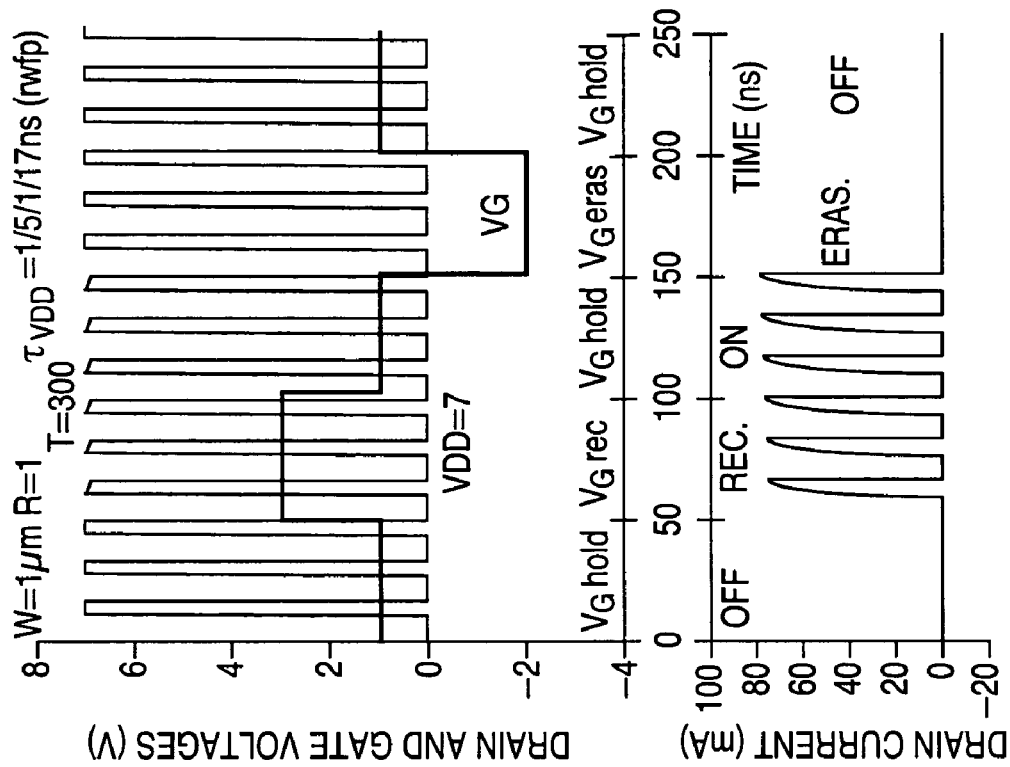
FIG. 2B provides waveforms associated with writing, storing and erasing operations for a memory cell in accordance with the concepts of the present invention with $R_{LOAD}=1$ in the case of isothermal conditions with the refreshing VDD pulse period value equal to 17 ns.
Figure 2A:
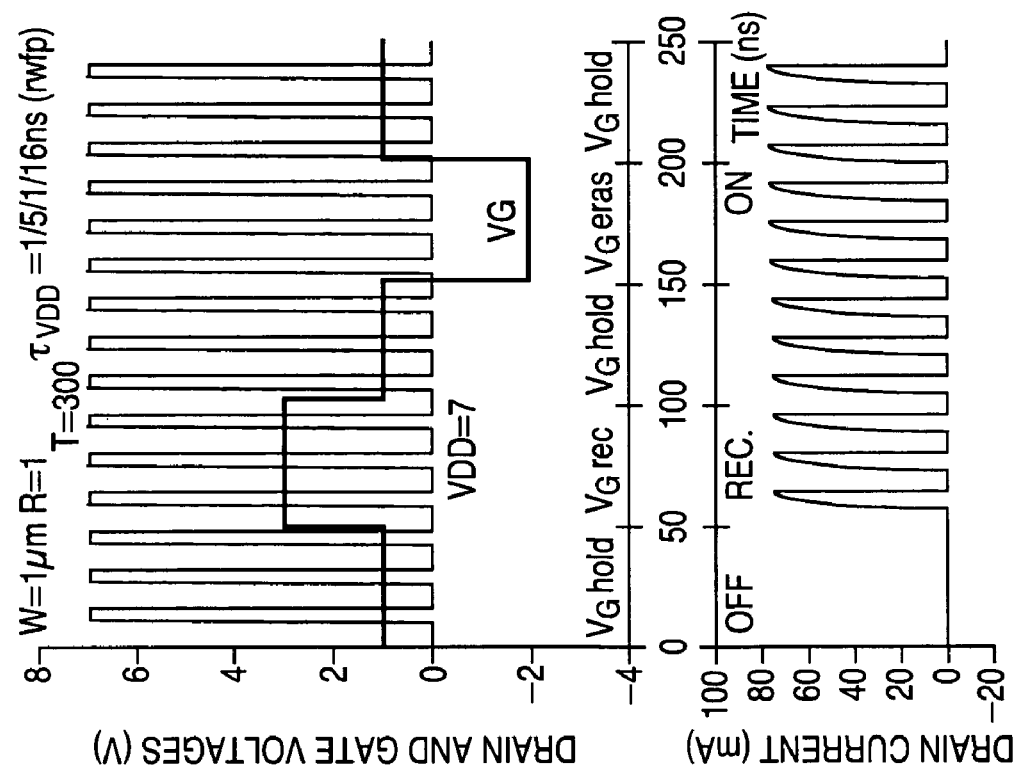
FIG. 2A provides waveforms associated with writing, storing and erasing operations for a memory cell in accordance with the concepts of the present invention with $R_{LOAD}=1$ in the case of isothermal conditions with the refreshing VDD pulse period value equal to 16 ns.
Figure 3A:
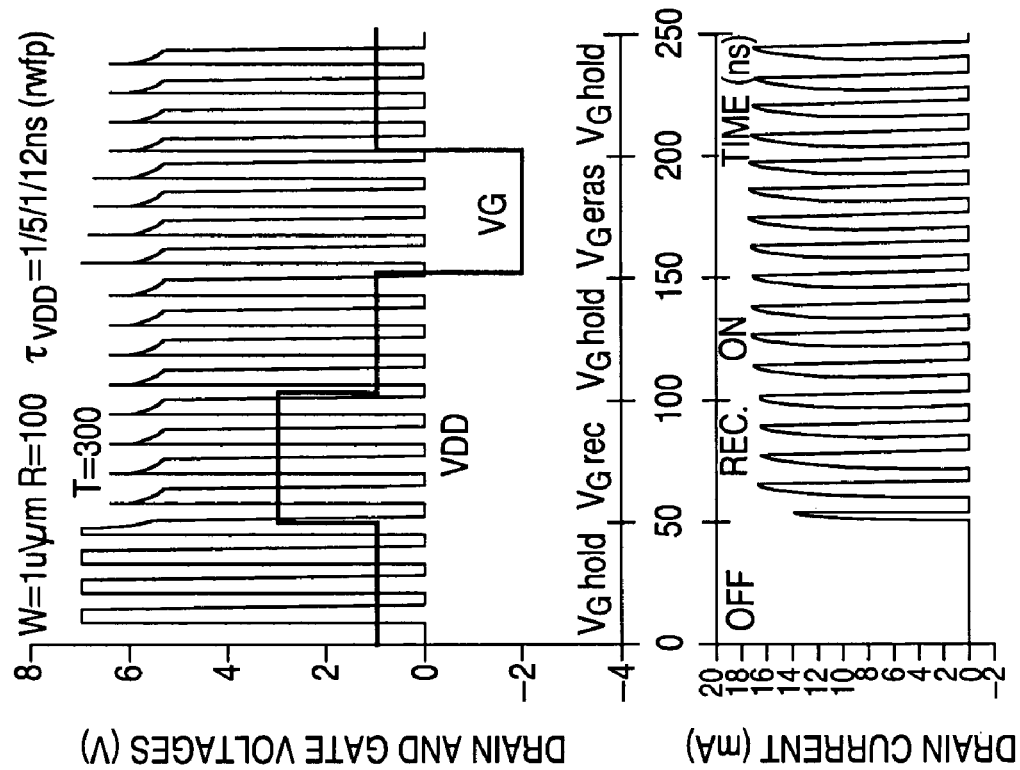
FIG. 3A provides waveforms associated with writing, storing and erasing operations for a memory cell in accordance with the concepts of the present invention with $R_{LOAD}=100$ in the case of isothermal conditions with the refreshing VDD pulse period value equal to 12 ns.
Figure 2C:
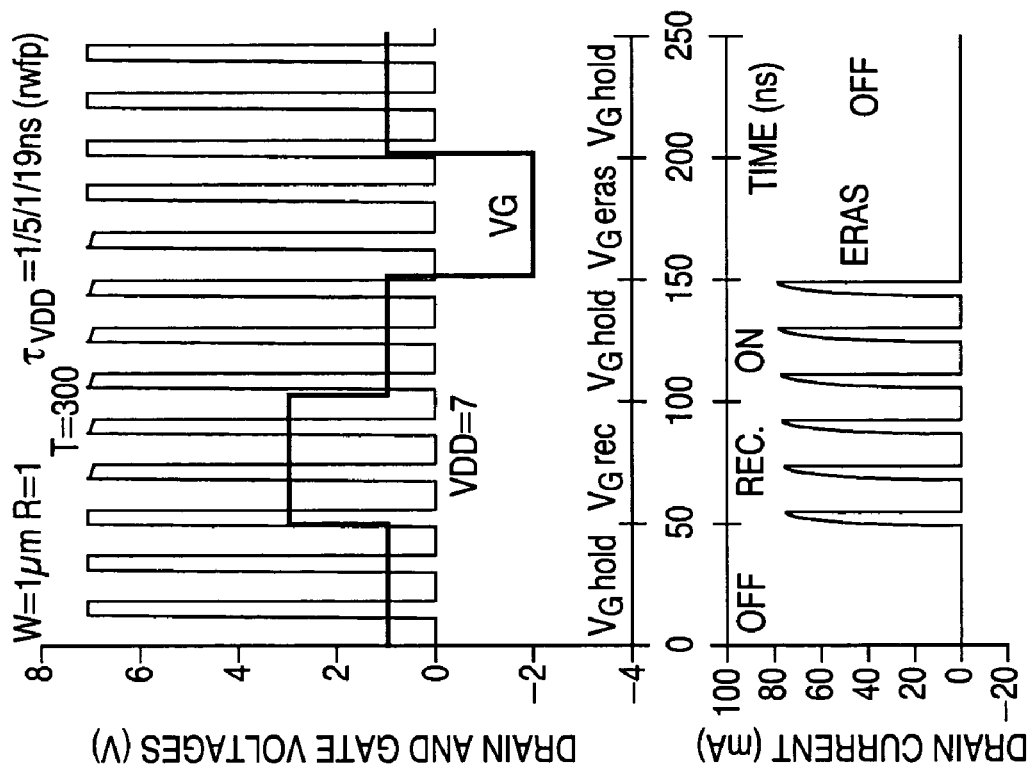
FIG. 2C provides waveforms associated with writing, storing and erasing operations for a memory cell in accordance with the concepts of the present invention with $R_{LOAD}=1$ in the case of isothermal conditions with the refreshing VDD pulse period value equal to 19 ns.
Figure 3C:
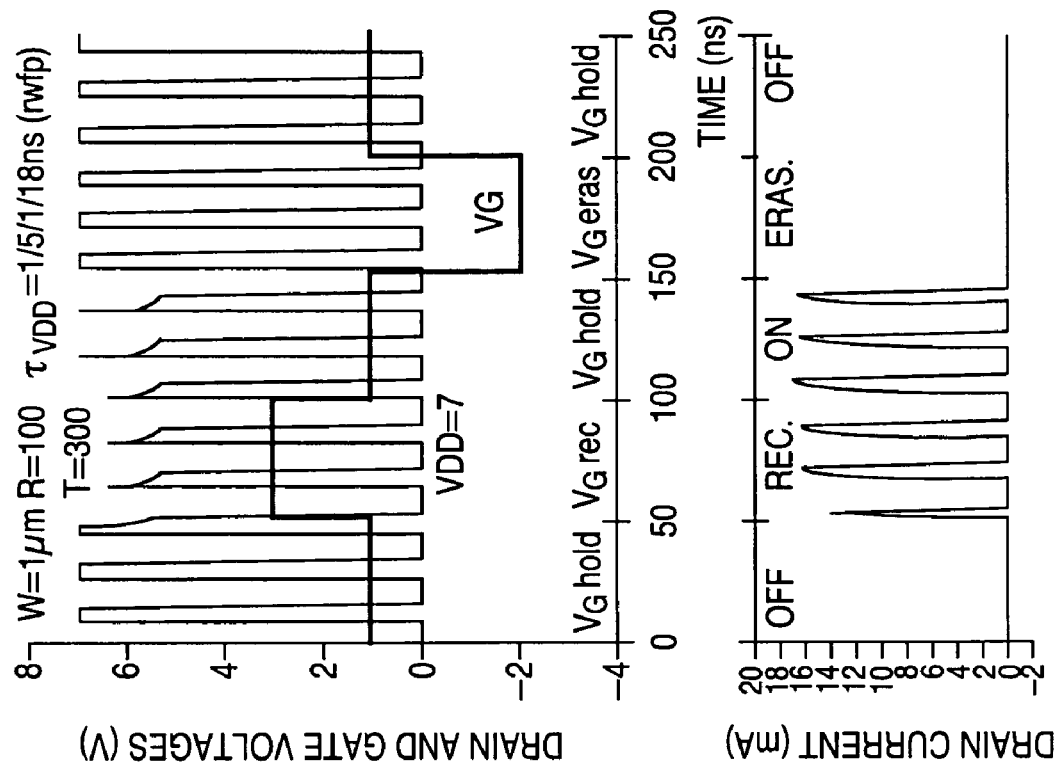
FIG. 3C provides waveforms associated with writing, storing and erasing operations for a memory cell in accordance with the concepts of the present invention with $R_{LOAD}=100$ in the case of isothermal conditions with the refreshing VDD pulse period value equal to 18 ns.
Figure 3B:
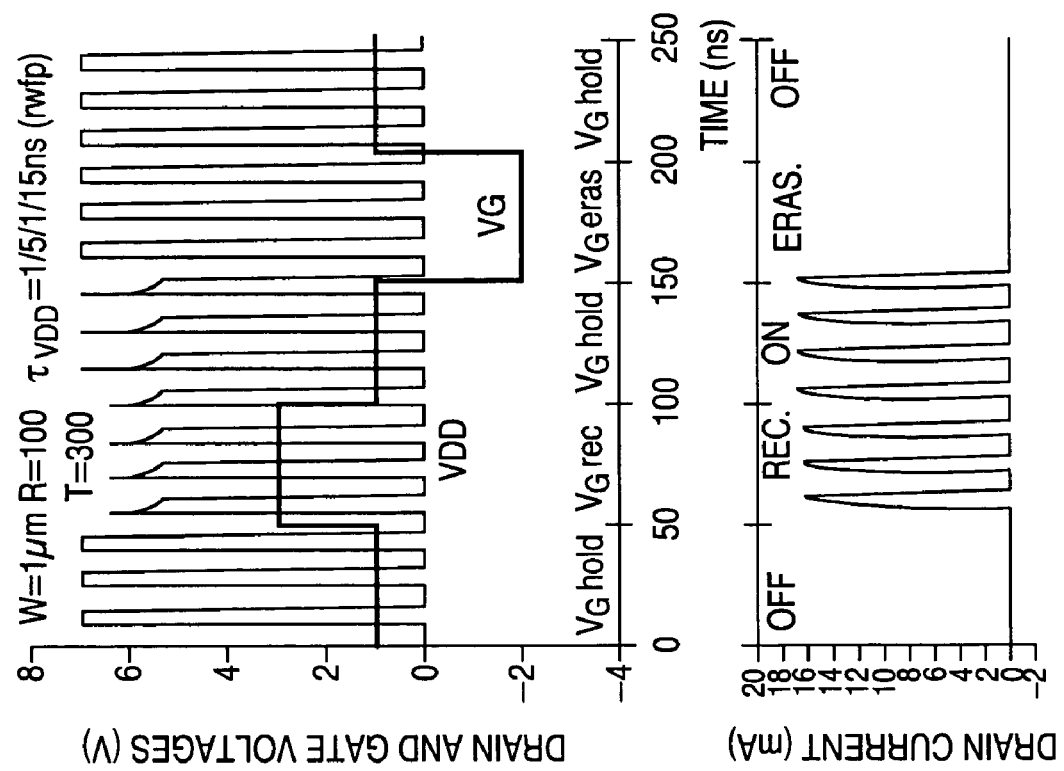
FIG. 3B provides waveforms associated with writing, storing and erasing operations for a memory cell in accordance with the concepts of the present invention with $R_{LOAD}=100$ in the case of isothermal conditions with the refreshing VDD pulse period value equal to 15 ns.
Figure 4:
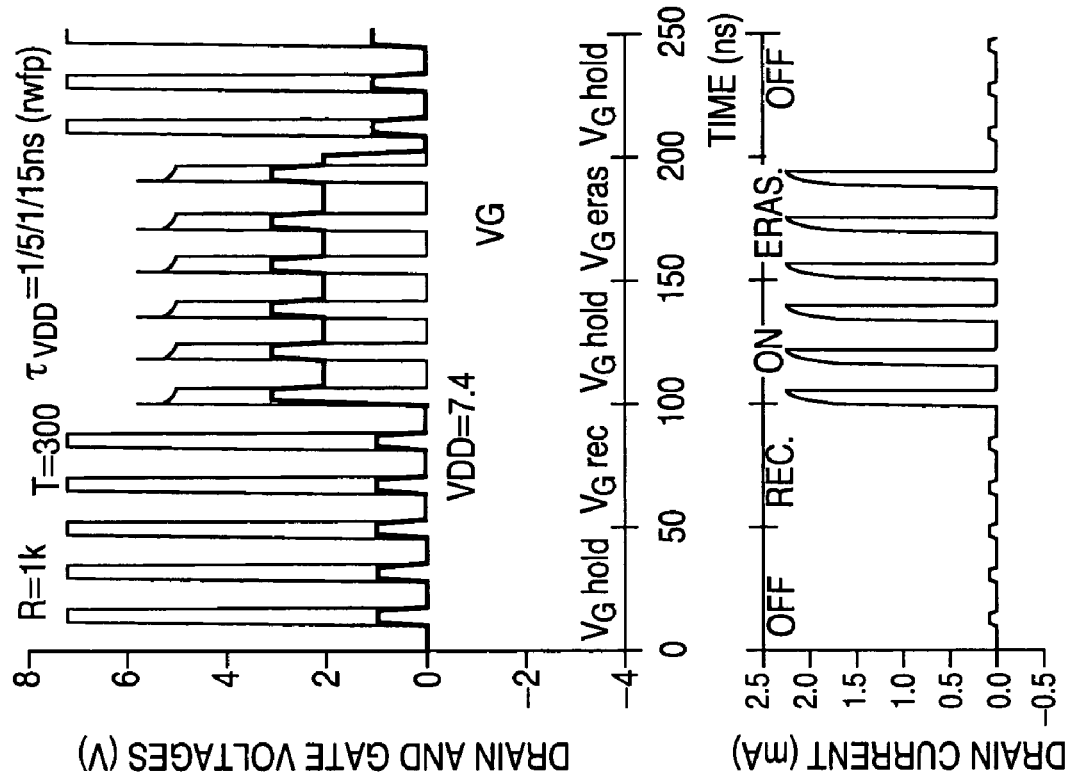
FIG. 4 provides waveforms showing current reduction with a 1 kOhm serial resistor associated with writing, storing and erasing operations for a memory cell in accordance with the present invention.
Figure 3D:
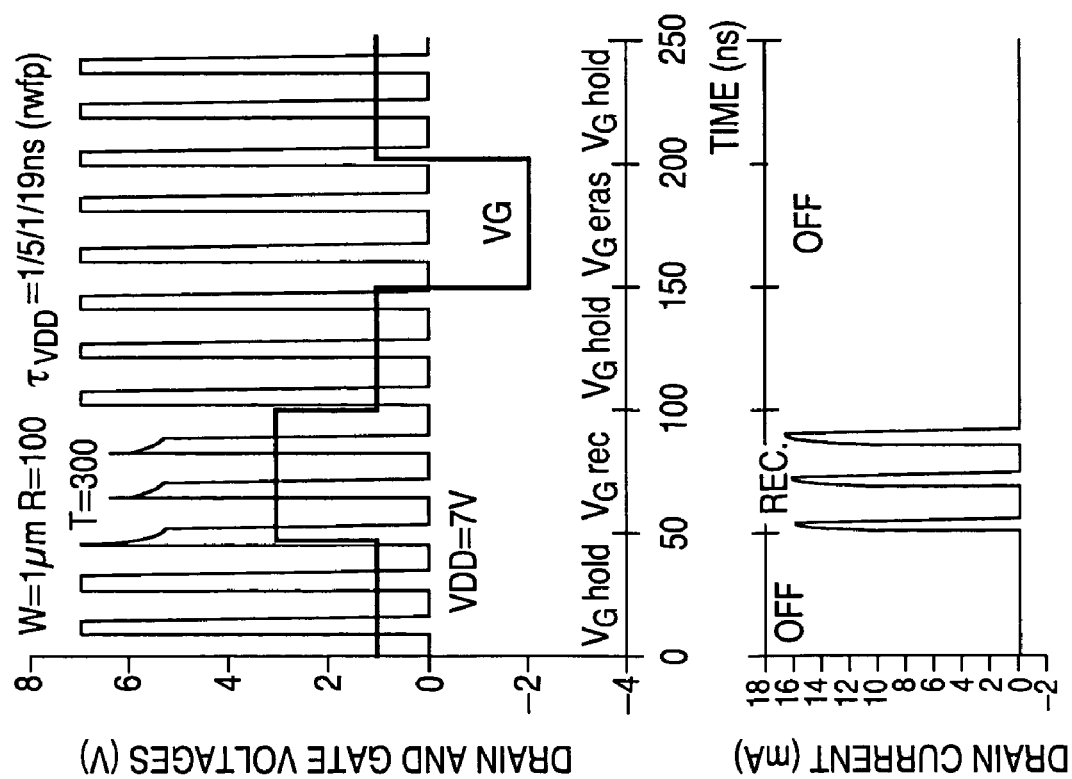
FIG. 3D provides waveforms associated with writing, storing and erasing operations for a memory cell in accordance with the concepts of the present invention with $R_{LOAD}=100$ in the case of isothermal conditions with the refreshing VDD pulse period value equal to 19 ns.
Figure 5:
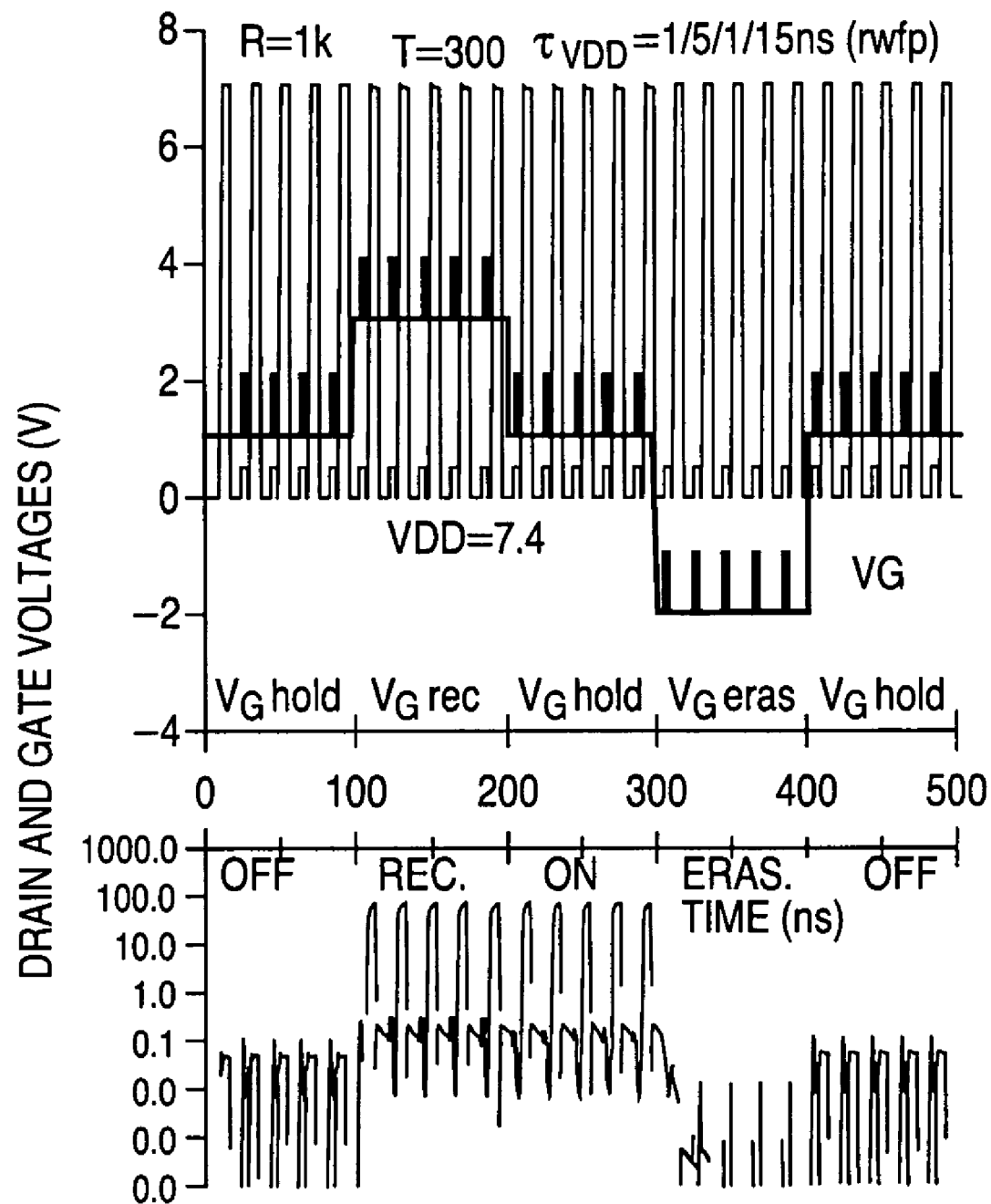
FIG. 5 provides waveforms showing current reduction with a 1 kOhm serial resistor associated with reading operations for a memory cell in accordance with the present invention.
Figure 6A:
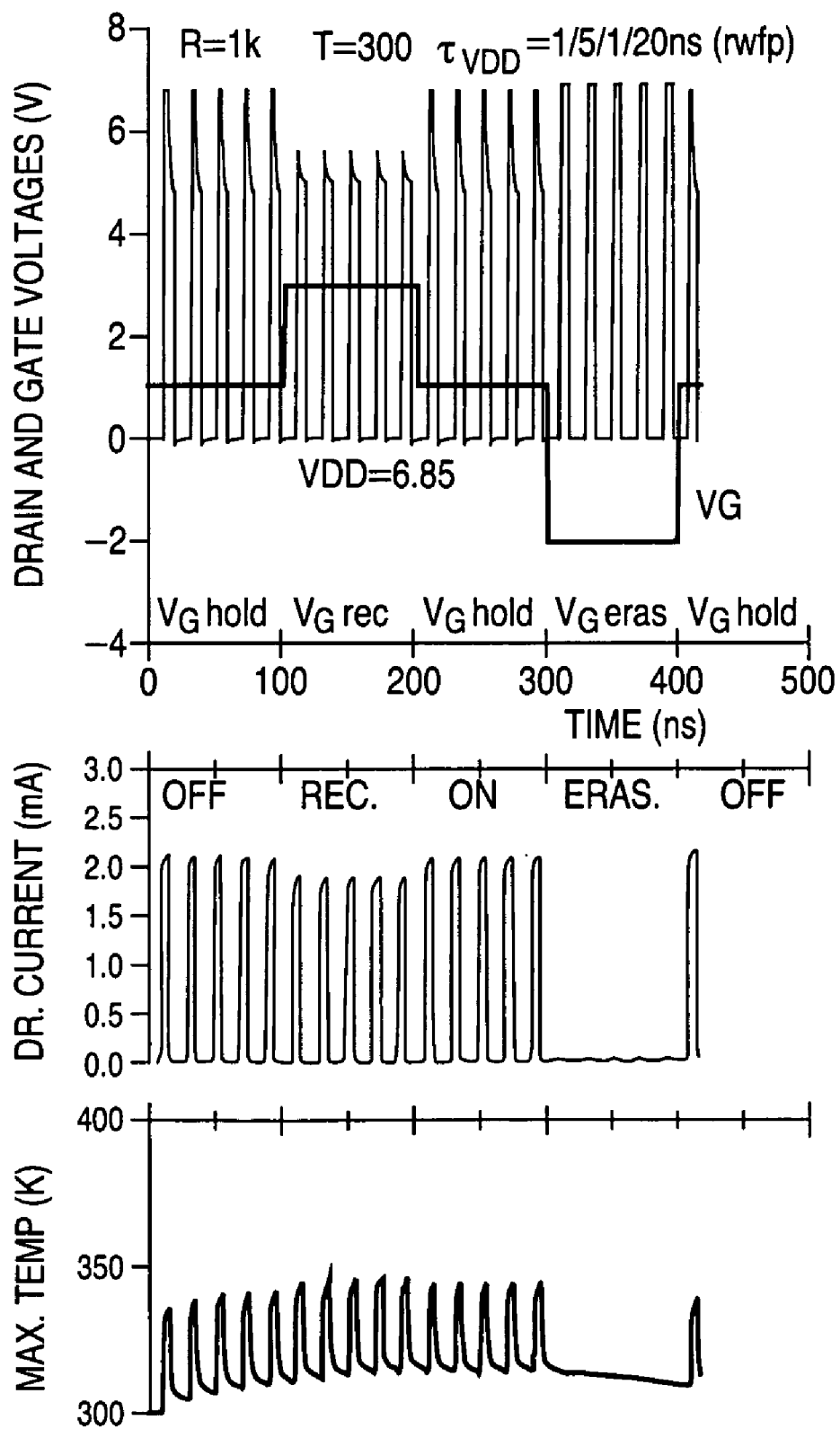
FIG. 6A provides waveforms showing current reduction with a 1 kOhm serial resistor associated with a reading operation for a memory cell in accordance with the present invention in an isothermal simulation.
Figure 6B:
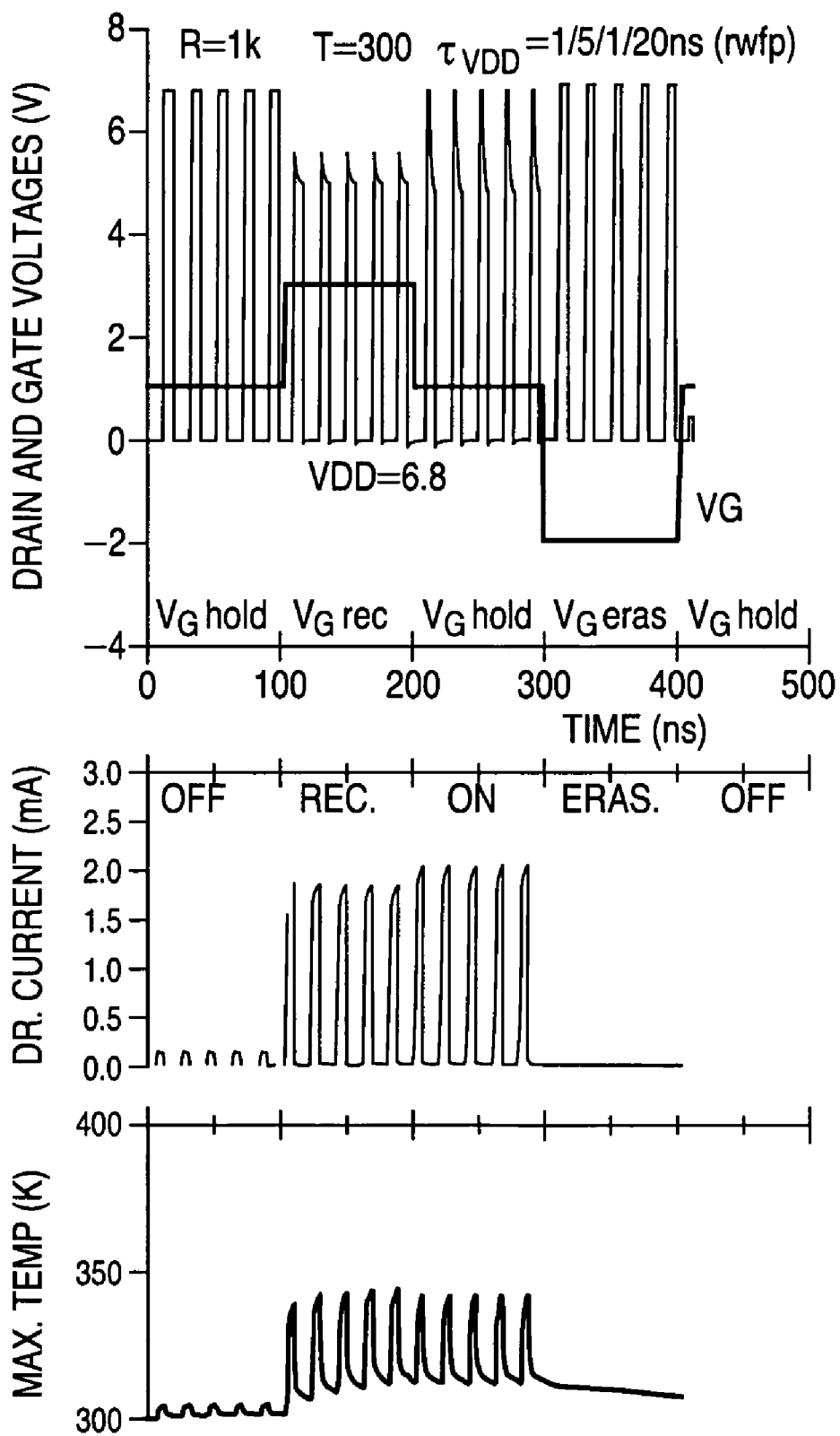
FIG. 6B provides waveforms showing current reduction with a 1 kOhm serial resistor associated with a reading operation for a memory cell in accordance with the present invention in a thermal coupled simulation.

The present invention provides a memory cell that is based upon a single NMOS device that is compatible with random access memory architectures and that can be realized using conventional CMOS processes with no or only minor process deviations.

The well-known snapback characteristics of the NMOS device due to parasitic NPN devices formed by pare are used to write and store information by periodically triggering the device from high to low impedance states using the self turn-on characteristics of the device under elevated voltage.

To minimize the power consumption in the "on" state, a pulsed operation mode is combined with dV/dt triggering powering the cells at a constant Vdd pulse amplitude.

In the programming mode, the dependencies of the drain source voltage Vds, the gate bias voltage Vgs and the residual injected carrier density (n, p) is utilized. The triggering voltage Vtds typically decreases with an increase in gate bias Vgs due to the larger channel current into the multiplication are of the NOMS device. That is, Vdst (Vgs_ON)<Vdd and Vdst(Vgs_OFF)>Vdd.

With respect to self-refreshing, in the time domain below the recombination time, the non-equilibrium carriers are still affecting the triggering voltage again to the larger current into the multiplication region of the NMOS device. Thus, if one period of time, properly selected, before (i.e., less than the recombination time) the device had experienced the "on" state operation mode, then there is some non-equilibrium density of carriers (n2, p2) still inside the device, thereby reducing the triggering level voltage Vdst below Vdd, i.e., Vdst<Vdd. Thus, the NMOS device will go into snapback again and self-refresh its state, maintaining Vdst (n2, p2)<Vdd. In contrast, if shortly before the new pulse, the NMOS device was in the "off" state mode and the non-equilibrium carrier density (n2, p2)<<(n1, p1) is close to the equilibrium, then there is no critical carrier density inside the drift region of the device and the triggering voltage Vdst (n1, p1)>Vdd. Therefore, the device does not turn on again, does not inject carriers and does not self-refresh. The injected carrier density decays to equilibrium.

Two types of erasing operations, based upon the gate or drain electrode potential change, are possible. The simplest case is based upon the condition that only when Vdst (Vgs_ON)<V(n, p)<Vdd, then the entire array can be erased by temporarily dropping Vdd itself. This will result in low n,p and Vdst (n,p~0)>Vdd. In the case when the device allows It should be understood that the particular embodiments of the invention described above have been provided by way of example and that other modifications may occur to those skilled in the art without departing from the scope and spirit of the invention as expressed in the appended claims and their equivalents.

What is claimed is:

1. A method of reading an NMOS memory cell that includes a gate, a source and a drain, the method comprising:
    applying a turn-on voltage to the gate of the memory cell to place the memory cell in an "on" state;
    refreshing the memory cell utilizing a sequence of periodic refresh voltage pulses, the refresh voltage pulses having gaps therebetween; and
    while the memory cell is in the "on" state, applying a gate-source read voltage and a drain-source read voltage to the memory cell during the gaps between the refresh voltage pulses.

2. A method as in claim 1, and wherein the refresh voltage pulses have a width of 0.1–10 ns and a period of 10–100 ns.

* * * * *